United States Patent [19]

Park et al.

[11] Patent Number: 4,942,447
[45] Date of Patent: Jul. 17, 1990

[54] BORDERLESS MASTER SLICE CMOS DEVICE

[75] Inventors: Hak-song Park; Byoung-jin Choi, both of Seoul; Heung-chul Oh, Kyounggi-do, all of Rep. of Korea

[73] Assignee: Samsung Electronics Co., Ltd., Suwon Kyounggi-do, Rep. of Korea

[21] Appl. No.: 357,038

[22] Filed: May 25, 1989

[30] Foreign Application Priority Data

Jul. 23, 1988 [KR] Rep. of Korea .................. 88-9291

[51] Int. Cl.⁵ .............................................. H01L 27/02
[52] U.S. Cl. ........................................ 357/42; 357/41
[58] Field of Search .................................... 357/41, 42

[56] References Cited

U.S. PATENT DOCUMENTS

| | | | |
|---|---|---|---|
| 4,644,382 | 2/1987 | Charransol et al. | 357/42 |
| 4,682,202 | 7/1987 | Tanizawa | 357/42 |
| 4,724,531 | 2/1988 | Angleton et al. | 357/42 |
| 4,766,475 | 8/1988 | Kawashima | 357/42 |
| 4,771,327 | 9/1988 | Usui | 357/42 |

Primary Examiner—Gene M. Munson
Attorney, Agent, or Firm—Morgan & Finnegan

[57] ABSTRACT

A borderless master slice semiconductor device is disclosed which comprises a plurality of first conduction type well regions arranged in a matrix type on the whole face of a second conduction type wafer; a plurality of second conduction type MOS transistor groups; a plurality of first conduction type diffusion regions arranged alterntely with the said second conduction type MOS transistor groups on the same row; a plurality of first conduction type MOS transistor groups arranged in a row direction facing opposingly with said second conduction type MOS transistor groups; and a plurality of second conduction type diffusion regions arranged alternately with said first conduction type MOS transistor groups on the same row. The device of the present invention thus constituted will bring the result that the master chip can be designed arbitrarily upon to the optimum size correspondingly with customer's order and that the production process can be singularized and the product control can be simplified.

7 Claims, 3 Drawing Sheets

BORDERLESS MASTER SLICE CMOS DEVICE

FIELD OF THE INVENTION

The present invention relates to a master slice semiconductor device, and particularly to a borderless master slice semiconductor device in which independent basic cell structures are formed throughout the whole area of the wafer in order to allow the size of the master chip to be arbitrarily decided.

BACKGROUND OF THE INVENTION

Generally, a master slice or gate array semiconductor device is arranged such that basic elements such as transistors and the like are arranged in a regular pattern on a master chip of a certain size, so that the customizing can be carried out by adding the wiring process.

A conventional gate array master chip 2 as shown in FIG. 2 which generally includes an internal logic circuit formation region 3 comprising a central cell array region 5 and a peripheral input/output cell region 6; and a bonding pad formation region 4 containing a plurality of bonding pads 7 around the input/output cell region 6, wherein the size of the master chip 2 has been normalized to a fixed level.

However, the size or area of the master chip is determined by the number of gates contained therein, and therefore a supplier of semiconductor devices manufactures and prepares different master wafers according to the number of gates in conformity with customer demand.

In turn, semiconductor devices are fabricated through the wiring process in gate arrays of a size the same as or larger than those required for the specific customized products.

Thus, conventional gate arrays are standardized, and therefore, designing to optimum chip size is too difficult for meeting customer demand. Additionally, a further disadvantage is that the production and the product control must be implemented for each size separately. Further, because only the limited gates provided in the standardized chip can be used, freedom of circuitry design is reduced.

SUMMARY OF THE INVENTION

With the foregoing in mind, it is an object of the present invention to overcome the foregoing disadvantages of conventional technology.

It is another object of the present invention to provide a borderless master slice semiconductor device in which the master chip size can be arbitrarily designed up to a desired size correspondingly to customer demand.

It is another object of the present invention to provide a borderless master slice semiconductor device in which the production process and the product control of master chips of various sizes is simplified.

A borderless master slice according to the present invention comprises a plurality of first conduction type independent well regions arranged in a row direction on the whole area of a semiconductor wafer, and a plurality of second intermediate regions arranged in a row direction between adjacent independent well regions. In the first conduction independent well regions are arranged a plurality of second conduction type MOS transistor groups in a row direction, and first conduction type diffusion regions are disposed at the opposite sides of the respective second conduction type MOS transistor groups. Further, the second conduction type intermediate regions include a plurality of first conduction type MOS transistor groups aligned in a row direction in correspondence to the second conduction type MOS transistor groups. At the opposite sides of the respective first conduction type MOS transistor groups, a plurality of second conduction type diffusion regions are formed.

At least two different type transistor groups and some diffusion regions within the respective independent well regions and the respective intermediate regions disposed on the whole area of the wafer in a matrix pattern constitute an independent basic cell, and thus, the main groups of transistors for constituting a master chip will be electrically stable even if some transistor regions are shared along scribing lines during a final wafer separation process.

Therefore, in accordance with the present invention, the addition of programmable layers through a multi-wiring process onto the above wafer containing a plurality of basic cells with no setting of scribing lines to realize a specific applied circuit enables the size of the master chip to be freely determined to any desired level.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE DRAWINGS

Figure 1:
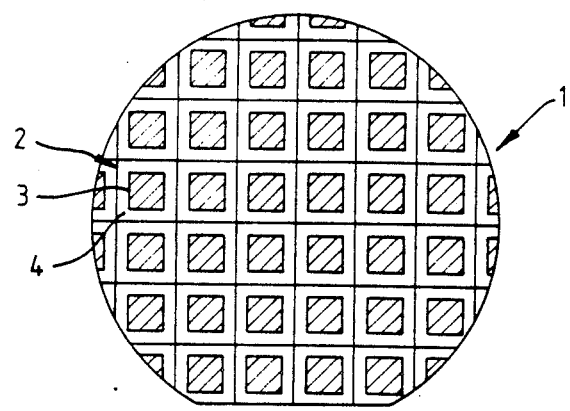
FIG. 1 is a plan view of a conventional gate array wafer.
Figure 2:
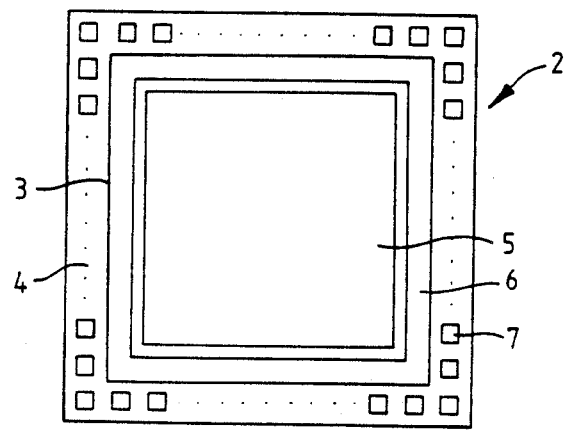
FIG. 2 illustrates an enlarged detail view of the conventional gate array master chip.
Figure 3:
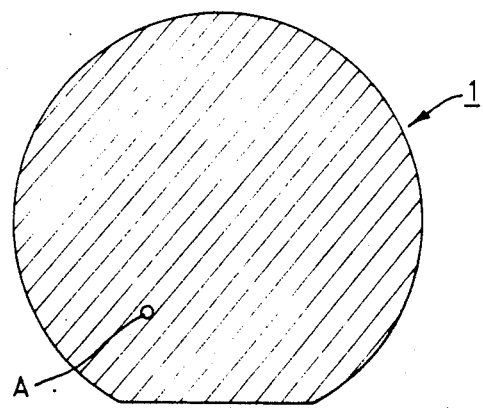
FIG. 3 is a plan view of the gate array master wafer according to the present invention.
Figure 4:
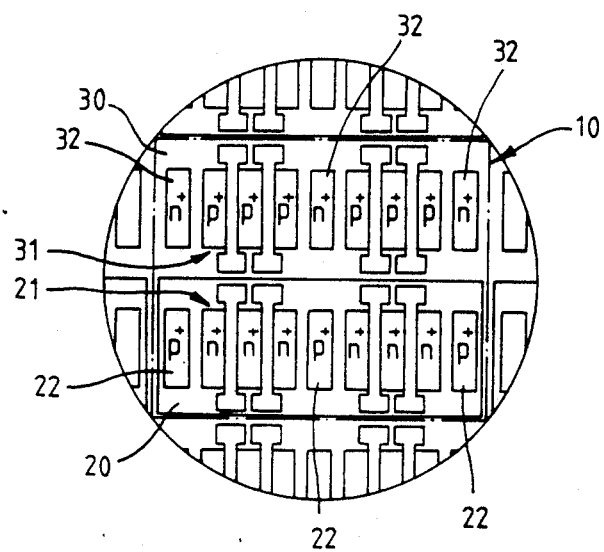
FIG. 4 is an enlarged plan view of portion A of FIG. 3.

FIG. 3 is a plan view of the gate array master wafer 1 according to the present invention, and FIG. 4 is an enlarged plan view of portion A of FIG. 3. Reference numeral 10 in FIG. 4 indicates the basic cell of the CMOS type gate array according to the present invention, which includes and independent well region 20 and an intermediate region 30 disposed between the independent well region 20 and another independent well region of the adjacent basic cell located in the column direction.

The independent well region 20 is composed of a conductive material (herein referred to "a first conductive material") different from a material of a semiconductor wafer (herein referred to "a second conductive material"), and is formed either by doping a p-type impurity into an n-type semiconductor wafer, or by doping an n-type impurity into a p-type semiconductor wafer. In the p-type well region, at least two groups of n-channel MOS transistors 21 are provided in a row direction.

A group of the n-channel MOS transistors groups 21 consists of a pair of n-channel MOS transistors which are provided with two current paths connected in series and two gate terminals arranged in parallel to each other in a row direction. The pair of the n-channel MOST transistors 21 are laid out in the form of a first n+ type region—a first silicon gate terminal—a second n+ type region—a second silicon gate terminal—a third n+ type region. The second n+ type region serves as the drain region for one of the two n-channel MOS transistors, and at the same time, serves as the source region for the other one of the two n-channel MOS transistors. Further, the p-type well region 20 includes the p+ type diffusion regions 22 disposed at the opposite sides of the respective n-channel MOS transistor groups.

As mentioned above, the intermediate region 30 is provided between the independent well regions which are arranged on an n-type semiconductor wafer (or a p-type semiconductor wafer) in the column direction. In the case where the intermediate region 30 comprises n-type material, the region 30 includes at least two groups of the p-channel MOS transistors disposed in the direction of the row, in such a manner that the p-channel MOS transistor groups 31 should oppsingly face at least two groups of the n-channel MOS transistors 21 within the independent well region 20.

A group of the p-channel MOS transistors 31 comprises a pair of p-channel MOS transistors having two current paths connected in series and two gate terminals arranged in parallel to each other in a row direction, and the p-channel MOS transistor groups 31 are also arranged in the form of a first p+ type region—a first silicon gate terminal—a second p+ type region—a second silicon gate terminal—a third p+ type region. The second p+ type region serves as the drain region for one of the two p-channel MOS transistors, and at the same time, serves as the source region for the other one of the two p-channel MOS transistors. Further, the intermediate region 30 includes three n+ type diffusion regions 32. These n+ type diffusion regions 32 are disposed at the opposite sides of the respective p-channel MOS transistor groups. The n+ type and p+ type diffusion regions 22 and 32 are used to make the potentials of the substrates within the well region 20 and the intermediate region 30 at fixed levels to prevent the latch-up phenomenon inherent in CMOS integrated circuits.

The basic cell 10 arranged as described above forms a pair of CMOS transistors, each of which has a group of n-channel MOS transistors 21 in the well region 20 and a group of p-channel MOS transistors 31 in the intermediate region 30 correspondingly located in a column. The basic cell 10 is also used to design an input-/output protection circuit installed between bonding pads and internal logic circuits.

Moreover, as described above, because a basic cell 10 according to the present invention is designed to have a plurality of CMOS transistors therein, even though any CMOS transistor becomes faulty during the fabricating process, the remaining CMOS transistors may still be utilized, resulting in the enhancement of products yield.

Figure 5:
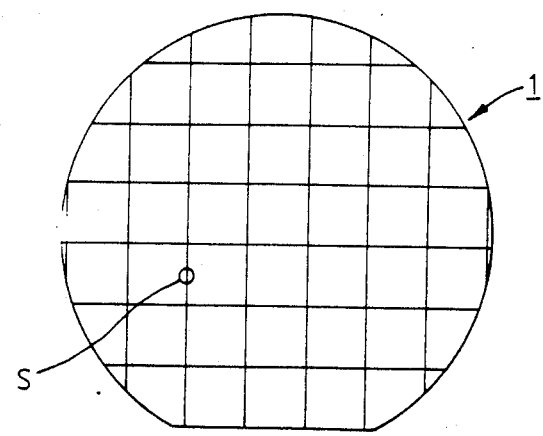
FIG. 5 is a plan view of the gate array master wafer showing a state after the formation of the master chip according to the present invention.

By means of the metal-wiring process based on a multilayer wiring technique, master chips are formed on the master wafer of the present invention, on which the basic cells 10 are formed over the whole area in a matix pattern as shown in FIG. 4. On the wafer, the master chips of FIG. 5 are formed by adding the formation of programmable layers, i.e., the multilayer wiring steps of: forming of contact holes; forming metal wiring of the first layer; forming of vertical vias; forming metal wiring of the second layer; and forming bonding pads.

The master chips include internal logic circuits installed by the central basic cell array, input/output protection circuits realized by the unused basic cells of the peripheral portion of the internal logic circuits, and bonding pads established on the basic cells remaining around the input/output protection circuits.

Figure 6:
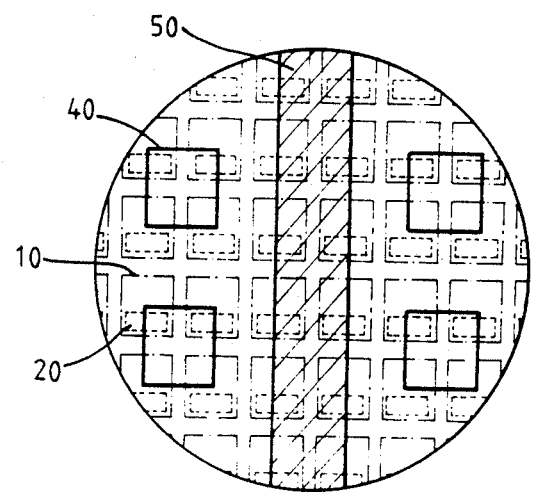
FIG. 6 is an enlarged plan view of portion S of FIG. 5.

To obtain the final master chips from the wafer, the unused basic cell portions around the region of the bonding pads 40, as shown in FIG. 6, are cut off by scribe line 50, but no electrical disorder will be generated because the respective basic cells are independently formed.

As described above, according to the present invention, independent basic cells are formed on the whole area of the wafer in a matrix pattern, and the sizes of chips for specific purposes are adaptively fabricated through the use of the multilayer wiring technique based on the customer's order. Therefore, the size of the chips can be optimized, and miniaturization of the chips is made possible. Further, the usable number of gates is not limited in designing the circuit, and therefore, arbitrariness is allowed in designing the circuit. According to the present invention, the supplier can produce the desired master wafers through the use of only a set of masks, and manage their production together regardless of the size of master chips, removing the conventional requirements that the gate arrays have to be produced in units of the same number of gates and that the production of gate arrays have to be managed separately for each different kind.

The present invention was described based on the preferred embodiment in the above, but it should be understood that the scope of the present invention will not be limited to the embodiment. For example, a wiring region can be provided separately in the intermediate region.

What is claimed:

1. A borderless master slice semiconductor device, comprising:
   a plurality of first conduction type independent well regions arranged on the whole area of a second conduction type semiconductor wafer in a row direction;
   a plurality of second conduction type MOS transistor groups arranged in a row direction within said first conduction type independent well regions, each of said second conduction type MOS transistor groups having respectively current paths connected in series and gate terminals arranged in parallel in a row direction;
   a plurality of first conduction type diffusion regions arranged at the opposite sides of said second conduction type MOS transistor groups in a line;
   a plurality of second conduction type intermediate regions disposed between said adjacent first conduction type independent well regions arranged in a column direction;
   a plurality of first conduction type MOS transistor groups arranged in a row direction within said second conduction type intermediate regions in correspondence to said second conduction type MOS transistor groups within said first conduction type independent well regions, each of said first conduction type MOS transistor groups having current paths connected in a series and gate terminals arranged in parallel in a row direction; and a plurality of second conduction type diffusion regions arranged at the opposite sides of said first conduction type MOS transistor groups in a line.

2. The borderless master slice semiconductor device according to claim 1, wherein a plurality of the master chips are formed through a multilayer wiring processes including, forming contact holes, forming first layer metal wiring, forming vertical vias, forming second layer metal wiring, and forming bonding pads.

3. The borderless master slice semiconductor device according to claim 1, wherein two groups of said first conduction type and said second conduction type transistors are provided respectively in said first conduction type well region and in said intermediate region establish a basic cell.

4. The borderless master slice semiconductor device according to claim 1, wherein at least one of said first conduction transistor groups and one of said second conduction transistor groups are provided to implement an internal logic circuit of master chips.

5. The borderless master slice semiconductor device according to claim 1, wherein at least one of said first conduction transistor groups and one of said second conduction transistor groups are provided to implement an input/output protection circuit.

6. The borderless master slice semiconductor device according to claim 1, 3, 4 or 5, wherein said second conduction type semiconductor wafer and said second conduction type immediate regions consist of n-type semiconductors, and said first conduction type well regions consist of p-type semiconductors, a plurality of said second conduction type MOS transistor groups consist of n-channel MOS transistors, a plurality of said first conduction type diffusion regions consist of p+ type semiconductors, said first conduction type transistor groups consist of p-channel MOS transistors, and a plurality of said second conduction type diffusion regions consist of n+ type semiconductors.

7. The borderless master slice semiconductor device according to claim 1, 3, 4 or 5, wherein said second conduction type semiconductor wafer and said second conduction type immediate regions consist of p-type semiconductors, and said first conduction type well regions consist of n-type semiconductors, a plurality of said second conduction type MOS Transistor groups consist of p-channel MOS transistors, a plurality of said first conduction type diffusion regions consist of n+ type semiconductors, said first conduction type transistor groups consist of n-channel MOS transistors, and a plurality of said second conduction type diffusion regions consist of p+ type semiconductors.

* * * * *